(12) United States Patent
Cho

(10) Patent No.: US 11,121,243 B2
(45) Date of Patent: Sep. 14, 2021

(54) 2D-3D HETEROJUNCTION TUNNEL FIELD-EFFECT TRANSISTOR

(71) Applicant: Korea Advanced Institute of Science and Technology, Daejeon (KR)

(72) Inventor: Sungjae Cho, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/930,422

(22) Filed: Jul. 16, 2020

(65) Prior Publication Data
US 2021/0020765 A1    Jan. 21, 2021

(30) Foreign Application Priority Data

Jul. 17, 2019 (KR) .................. 10-2019-0086206

(51) Int. Cl.
| | |
|---|---|
| H01L 29/76 | (2006.01) |
| H01L 29/24 | (2006.01) |
| H01L 29/45 | (2006.01) |
| H01L 29/66 | (2006.01) |
| H01L 29/786 | (2006.01) |
| H01L 29/18 | (2006.01) |

(52) U.S. Cl.
CPC .......... *H01L 29/7606* (2013.01); *H01L 29/18* (2013.01); *H01L 29/24* (2013.01); *H01L 29/45* (2013.01); *H01L 29/66969* (2013.01); *H01L 29/66977* (2013.01); *H01L 29/78648* (2013.01); *H01L 29/78696* (2013.01)

(58) Field of Classification Search
CPC ..... H01L 29/7606; H01L 29/18; H01L 29/24; H01L 29/45; H01L 29/66969; H01L 29/66977; H01L 29/78648; H01L 29/78696

USPC .......................................................... 257/27
See application file for complete search history.

(56) References Cited

U.S. PATENT DOCUMENTS

| | | |
|---|---|---|
| 2016/0300958 A1 | 10/2016 | Park et al. |
| 2018/0204953 A1* | 7/2018 | Zhu ..................... H01L 29/267 |
| 2019/0097014 A1 | 3/2019 | Lee et al. |

FOREIGN PATENT DOCUMENTS

| | | |
|---|---|---|
| JP | 201779313 A | 4/2017 |
| KR | 1020160120057 A | 10/2016 |
| KR | 1020190005080 A | 1/2019 |

(Continued)

OTHER PUBLICATIONS

Zeng et al., "Novel Optoelectronic Devices: Transition-Metal-Dichalcogenide-Based 2D Heterostructures", Advanced Electronic Materials, 2018, vol. 4, 1700335, 20 pages.

(Continued)

*Primary Examiner* — Tong-Ho Kim
(74) *Attorney, Agent, or Firm* — The Webb Law Firm

(57) ABSTRACT

Disclosed is a 2D-3D HJ-TFET made of a material, the band gap of which changes according to the thickness, such as black phosphorous or TMDC, in order to extend Moore's law. More particularly, disclosed are the structure of a 2D-3D HJ-TFET and a method for manufacturing the same, wherein the 2D-3D HJ-TFET is made of a material such as black phosphorous or TMDC such that the same consumes less power, has a high switching speed, can operate in a complementary manner so as to replace a conventional CMOS transistor, and can extend Moore's law.

20 Claims, 9 Drawing Sheets

(56) References Cited

FOREIGN PATENT DOCUMENTS

KR        1020190012050 A    2/2019
KR        1020190119451 A    10/2019

OTHER PUBLICATIONS

Li et al., "Sub-10nm vertical tunneling transistors based on layered black phosphorene homojunction", Applied Surface Science, 2018, vol. 465, pp. 895-901.
Li et al., "High-performance sub-10-nm monolayer black phosphorene tunneling transistors", Nano Research, 2018, vol. 11(5), pp. 2658-2668.
Dankert et al., "Electrical gate control of spin current in van der Waals heterostructures at room temperature", Nature Communications, 2017, DOI 10.1038/ncomms16093.
Shim et al., "Recent progress in Van der Waals (vdW) heterojunction-based electronic and optoelectronic devices", Carbon, 2018, vol. 133, pp. 78-89.
Sarkar et al., "A subthermionic tunnel field-effect transistor with an atomically thin channel", Nature, 2015, vol. 526, pp. 91-95.
Kim et al., "Thickness-controlled black phosphorus tunnel field-effect transistor for low-power switches", Nature Nanotechnology, 2020, vol. 15, pp. 203-206.
Pop, "Energy Dissipation and Transport in Nanoscale Devices", Nano Research, 2010, vol. 3, p. 147, pp. 20.
Tomioka et al., "Steep-slope Tunnel Field-Effect Transistors using III-V Nanowire/Si Heterojunction", 2012, Symposium on VLSI Technology Digest of Technical Papers, p. 47.
Kim et al., "Monolayer Hexagonal Boron Nitride Tunnel Barrier Contact for Low-Power Black Phosphorus Heterojunction Tunnel Field-Effect Transistors", Nano Lett., 2020, vol. 20, pp. 3962-3969.

* cited by examiner

2D-3D HETEROJUNCTION TUNNEL FIELD-EFFECT TRANSISTOR

CROSS-REFERENCE TO RELATED APPLICATION

This application claims priority to Korean Patent Application No. 10-2019-0086206 filed Jul. 17, 2019, the disclosure of which is hereby incorporated by reference in its entirety.

BACKGROUND OF THE INVENTION

1. Field of the Invention

The present disclosure relates to a novel tunnel field-effect transistor (TFET) which consumes less power, which has a high switching speed, which can operate in a complementary manner so as to replace a complementary metal-oxide semiconductor (CMOS) transistor, and which is configured to extend Moore's law. More particularly, the present disclosure relates to the structure of a 2D-3D heterojunction tunnel field-effect transistor (HJ-TFET) employing a material, the band gap energy of which changes depending on the thickness thereof, such as black phosphorous or transition metal dichalcogenide (TMDC), and a method for manufacturing the same.

2. Description of the Prior Art

Due to power consumption limitations, the level of integration and compactness of transistors, which has been increasing according to Moore's law, has recently undergone little increase. A recent international research report (Pop, E. 2010, Nano Res. 3, 147) has reported that, as a result of transistor integration, the standby power consumption, when a transistor is turned off, which has previously been at a neglectable level, has become comparable to switching power consumption when the transistor is turned on. In order to simultaneously reduce the switching power consumption and the standby power consumption when the transistor is turned on and off, respectively, it is necessary to lower the subthreshold swing (SS) of the transistor, which refers to a switching voltage needed to increase the current by a decade (ten times), below 60 mV/dec, which is the room-temperature threshold of a CMOS transistor.

As an alternative thereto, there has been active study on a tunnel FET (TFET) capable of operating by means of band-to-band tunneling (BTBT) and thus accomplishing SS that is lower than 60 mV/dec at room temperature. However, contrary to such a theoretical prediction, TFETs that have purportedly accomplished SS less than 60 mV/dec at room temperature in a current area of four decades have very small $I_{60}$ (source-drain current when SS=60 mV/dec) due to problems such as defects occurring at the junction interface of two materials, oxide thin films, and lattice mismatch, thereby revealing a limitation in that the switching speed thereof is lower than that of CMOS transistors by 100-100,000 times (see Tomioka, K., et. al., 2012, Symposium on VLSI Technology, 47, Sarkar, D. et. al., 2015, Nature 526, 91). Moreover, in connection with TFETs that have purportedly accomplished SS less than 60 mV/dec at room temperature in a current area of four decades, only two n-type heterojunction tunnel field-effect transistors (HJ-TFETs) exist, and p-type HJ-TFETs have not yet been developed.

Therefore, development of novel low-power complementary TFETs capable of extending Moore's law in place of existing CMOS transistors is, at the current point of time, deemed urgent and crucial to the progress of human information communication science technology.

SUMMARY OF THE INVENTION

The present disclosure has been made in order to solve the above-mentioned problems in the prior art, and an aspect of the present disclosure is to provide the structure of a 2D-3D heterojunction tunnel field-effect transistor (HJ-TFET) employing a material, the band gap energy of which changes depending on the thickness thereof, such as black phosphorous or transition metal dichalcogenide (TMDC), and a method for manufacturing the same, wherein the HJ-TFET consumes less power, has a high switching speed, can operate in a complementary manner so as to replace a conventional CMOS transistor, and can extend Moore's law.

To summarize features of the present disclosure, a transistor in accordance with an aspect of the present disclosure includes: a back-gate electrode; a first insulating film formed on the back-gate electrode; a heterojunction material layer formed on the first insulating film and made of a first material, band-gap energy of which changes according to a thickness, the heterojunction material layer including a first thickness part for a source area and a second thickness part for a channel area and a drain area, thereby having a thickness difference; a source electrode formed in the source area of the first thickness part; a drain electrode formed in the drain area of the second thickness part; and a top-gate electrode formed in the channel area of the second thickness part.

The transistor may further include a second insulating film and a graphite electrode layer or a metal electrode layer formed in the drain area of the heterojunction material layer.

The transistor may further include a third insulating film covering the heterojunction material layer in the source area and the channel area and the graphite electrode layer or the metal electrode layer in the drain area. The drain electrode may be formed on the graphite electrode layer or the metal electrode layer in the drain area of the heterojunction material layer. The top-gate electrode may be formed on the third insulating film in the channel area of the heterojunction material layer.

The heterojunction material layer may include a structure in which the first thickness part is a bulk (3D) material layer, and the second thickness part is a monolayer (2D) material layer. Since the band-gap energy of BP or TMDC changes according to the thickness, a natural heterojunction may be formed within a single material layer, even without using different materials according to a band-gap change between the first thickness part (3D) and the second thickness part (2D).

The second insulating film may include a hBN film grown in a chemical vapor deposition (CVD) or epitaxy type, or a high-κ insulating film deposited in an atomic layer deposition (ALD) type. The second insulating film may have a thickness or 1 nm or less, and may function as a tunnel barrier between the graphite electrode layer or the metal electrode layer and the 2D material (BP or TMDC or any other 2D material) in the drain area.

The heterojunction material layer may include a Van der Waals material layer having a layered structure including black phosphorus (BP), transition metal dichalcogenide (TMDC) or other 2D materials such as tellurene and GeP.

The first insulating film may include an insulating film double-layer. The first insulating film may include a high-κ insulating film and a monolayer hBN film thereon. The high-κ insulating film is for the purpose of improving the gate efficiency, and the monolayer hBN film is for the purpose of protecting the material characteristics of the material layer (for example, BP or TMDC).

The transistor may further include a fourth insulating film between the third insulating film and the top-gate electrode, on the heterojunction material layer in the channel area. The third insulating film may be a monolayer hBN film, and the fourth insulating film may include a high-K insulating film. Likewise, the high-K insulating film is for the purpose of improving the gate efficiency, and the monolayer hBN film is for the purpose of protecting the material characteristics of the material layer (for example, BP or TMDC).

When the second insulating film and the graphite electrode layer or the metal electrode layer are formed on an upper surface and a side surface of the drain area of the heterojunction material layer, the drain electrode may be structured to contact the graphite electrode layer or the metal electrode layer.

The transistor may operate in an n-type or in a p-type according to polarity of a bias voltage applied between the drain electrode and the source electrode.

A method for manufacturing a transistor in accordance with another aspect of the present disclosure may include the steps of: forming a back-gate electrode; forming a first insulating film formed on the back-gate electrode; forming a heterojunction material layer on the first insulating film by using a first material, band-gap energy of which changes according to a thickness, the heterojunction material layer including a first thickness part for a source area and a second thickness part for a channel area and a drain area, thereby having a thickness difference, the first thickness part and the second thickness part having different thicknesses; and forming a source electrode in the source area of the first thickness part, a drain electrode in the drain area of the second thickness part, and a top-gate electrode in the channel area of the second thickness part.

The method may further include a step of forming a second insulating film and a graphite electrode layer or a metal electrode layer formed in the drain area of the heterojunction material layer.

The method may further include a step of forming a third insulating film so as to cover the heterojunction material layer in the source area and the channel area and the graphite electrode layer or the metal electrode layer in the drain area. The drain electrode may be formed on the graphite electrode layer or the metal electrode layer in the drain area of the heterojunction material layer. The top-gate electrode may be formed on the third insulating film in the channel area of the heterojunction material layer.

According to the structure of a 2D-3D HJ-TFET and a method for manufacturing the same according to an embodiment of the present disclosure, the same consumes less power, has a high switching speed, can provide a p-type TFET, can operate in a complementary manner, can replace a conventional CMOS transistor, and can extend Moore's law.

Conventional TFETs have a problem in that the on-state current $I_{60}$ when SS is less than 60 mV/dec is smaller than the range of values necessary to replace commercialized CMOS transistors by 100-100,000 times. However, the 2D-3D HJ-TFET according to an embodiment of the present disclosure is fabricated through adjustment of the thickness of a single material, not by combining two materials, by using the unique characteristics of a first material, the band gap of which changes according to the thickness, such as BP, TMDC or other 2D materials such as tellurene and GeP.

Accordingly, it is possible to avoid problems such as defects occurring at the interface of two materials, oxide thin films, and lattice mismatch, and $I_{60}$>10 μA/μm can be accomplished.

In addition, conventional TFETs have a problem in that it is impossible to implement a p-type TFET satisfying room-temperature average SS<60 mV/dec. However, the 2D-3D HJ-TFET according to an embodiment of the present disclosure has a high-K insulator ($HfO_2$) tunnel barrier between the drain material and the metal (or graphite) electrode such that a single element can operate in n-type or in p-type according to the sign of the source-drain voltage. Accordingly, a high-performance complementary TFET can be implemented to replace a CMOS transistor, and, ultimately, Moore's law can be extended.

Therefore, the 2D-3D HJ-TFET according to an embodiment of the present disclosure is advantageous in that it is possible to implement a high-performance super-low-power complementary TFET satisfying room-temperature average SS over 4-5 decades of current ($SS_{ave\_4\text{-}5dec}$)<20 mV/dec, $I_{60}$>10 μA/μm, $V_{DD}$<0.3V; switching power consumption can be reduced below 0.01 fJ, that is, at least ten times smaller compared with a latest existing CMOS (>0.1 fJ); and switching delay can be lowered to 1-10 ps, that is, at least ten times smaller compared with 100 ps of CMOSs. Accordingly, the present disclosure can provide next-generation super-low power TFETs, thereby providing the foundation to develop a technology that can lead domestic/overseas non-memory semiconductor markets. Particularly, the present disclosure is expected to provide a core technology that will lead the future in the non-memory semiconductor field and to have a widespread influence on the industry and economy.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

Figure 1:
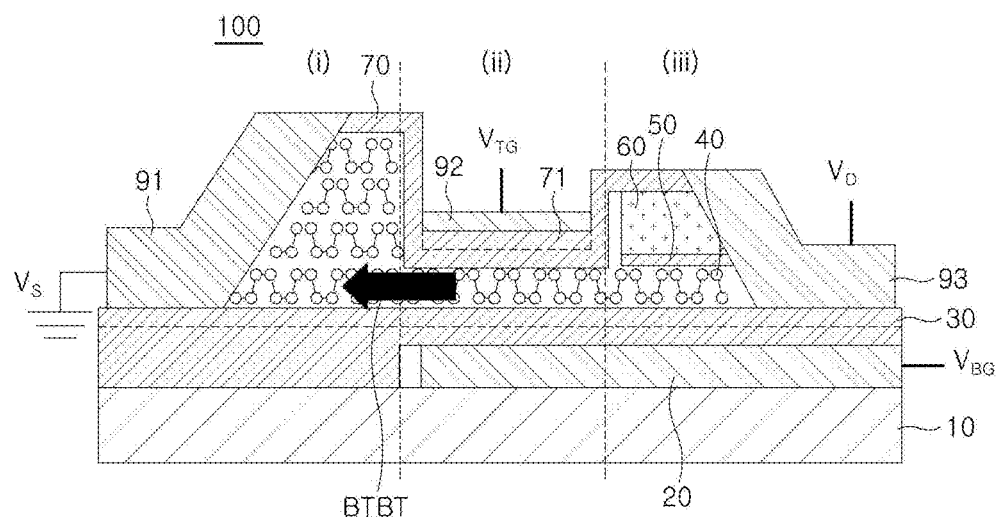
FIG. 1 is a sectional view of a 2D-3D HJ-TFET according to an embodiment of the present disclosure.

The motive for arriving at the present disclosure and the theoretical background thereof will now be described in detail.

Conventional down scaling of transistors according to Moore's law has enabled today's information technology, but Moore's law is approaching its limit. That is, as described above, a conventional complementary metal-oxide semiconductor (CMOS) transistor needs at least 60 mV of switching voltage (subthreshold swing (SS) 60 mV/dec) each time the current increases ten times.

As an alternative thereto, TFETs are widely studies as a candidate group for accomplishing SS far lower than 60 mV/dec by means of high ON current $I_{60}$ (current at which SS becomes 60 mV/dec), due to sub-thermionic SS.

More specifically, it is theoretically predicted that HJ-TFETs will have high $I_{60}$, and conventional research has failed to satisfy the theoretically expected value due to problems such as defects occurring at the heterojunction (HJ) interface made of heterogenous materials.

In this connection, the present disclosure seeks to propose a 2D-3D HJ-TFET having a heterojunction material layer having a changing layer thickness, made of a first material, the band gap energy of which changes depending on the thickness, such as black phosphorous (BP) or transition metal dichalcogenide. Accordingly, during a previous test of a 2D-3D HJ-TFET made of a first material such as BP, the present inventor was able to implement the all-time-low average SS, over 4-5 decades of current, of $SS_{ave\_4dec} \approx 22.9$ mV/dec and $SS_{ave\_5dec} \approx 26.0$ mV/dec with record high $I_{60}$ (=0.65-1 µA/µm), while satisfying Moore's law (see Nature Nanotechnology 15, 203 (2020). More recently, the inventor demonstrated $SS_{ave\_4dec} \approx 37.5$ mV/dec (<60 mV/dec) with even higher $I_{60}$=19.5 µA/µm (>10 µA/µm) (see Nano Letters 5, 3963 (2020)).

More specifically, integration and down-scaling of CMOS transistors according to Moore's law have dramatically changed the ability to process and deliver digital data, and thus changed almost every aspect of human lives and societies for the past fifty years. However, additional scaling transistors have reached limits, mainly due to power consumption. One of existing theses (for example, by Pop, 2010) shows that standby power consumption $P_{standby}$ that has previously been neglectable has reached a switching power $P_{switching}$ consumption level (see [Equation 1] and [Equation 2]).

In this regard, in order to reduce switching and standby power consumptions while additionally scaling transistors, it is necessary to overcome SS=60 mV/dec, which is the limit level by thermionic ions, on the basis of Equation 3, in connection with existing metal-oxide-semiconductor field-effect transistors (MOSFET).

$$P_{switching} = fCV_{DD}^2 \quad \text{[Equation 1]}$$

wherein f refers to a clock frequency, C refers to a total capacitance at an output node, and $V_{DD}$ refers to a supply voltage.

$$P_{standby} = V_{DD}I_{off} \quad \text{[Equation 2]}$$

wherein $V_{DD}$ refers to a supply voltage, and $I_{off}$ refers to an off-state current.

$$SS = \frac{dV_G}{d(\log I_D)} = \ln(10)\frac{k_B T}{q}\left(1 + \frac{C_{ch}}{C_{ox}}\right) \quad \text{[Equation 3]}$$

wherein $V_G$ refers to a gate voltage; $I_D$ refers to a source-drain current; $k_B$ refers to the Boltzmann constant; T refers to the absolute temperature; q refers to the electric charge of an electron; $C_{ch}$ refers to a channel capacitance; and $C_{ox}$ refers to the capacitance of a gate insulating film.

The fundamental limitation regarding the SS of such MOSFETs results from the thermal carrier injection mechanism for preventing an additional decrease in the transistor supply voltage $V_{DD}$ necessary to switch transistors from off-states to on-states. In addition, in order to reduce power consumption at SS<60 mV/dec, a high on-current must follow such that following transistors can be driven fast. International Roadmaps for Devices and Systems (IRDS) predict that a new device structure with a new material, which exceeds CMOSs, will be required in the near future to solve the transistor scaling problem. In this regard, Nikonov and Young compared ultimate circuit performances of many alternatives to CMOS devices and identified tunnel transistors as a promising technology.

Particularly, the SS inside TFETs may substantially decrease below the SS limit (60 mV/dec) of thermionic charge injection, due to the cold charge injection mechanism of band-to-band tunneling (BTBT), and TFETs have been proposed as a major alternative to MOSFETs.

However, despite intensive research, no TFETs appropriate for low-power applications have been implemented, due to two major simultaneous requirements regarding TFETs for replacing MOSFETs. More specifically, 1) $SS_{ave\_4-5dec}$<60 mV/dec, which is the average SS at 4-5 decades of current at room temperature, and 2) high $I_{60}$=1-10 µA/µm, which is similar to the on-current level at the threshold voltage $V_{th}$ of the latest MOSFETs, have fail to be accomplished.

That is, implementation of p-type TFETs has not been reported to date, and it has been reported that n-type TFETs accomplish $SS_{ave\_4dec}$<60 m V/dec at T=300 K in some cases. However, implemented $I_{60}$ is lower than the required range by 2-5 orders. The on-current inversely proportional to the switching delay time, and increasing $I_{60}$ is therefore crucial to operating a TFET-based logic gate at a higher speed.

The $I_{60}$ is mainly dependent on that BTBT tunneling probability that may be calculated by a Wentzel-Kramer-Brillouin approximation method as defined by [Equation 4] below, wherein $\Delta\Phi$ refers to a BTBT energy window, $\lambda$ refers to a screening tunneling depth, m* refers to a carrier effective mass, Eg refers to a band gap, e refers to the electric charge of an electron, and $\hbar$ refers to the Planck constant.

$$T_{WEB} \approx \exp\left(-\frac{4\lambda\sqrt{2m*E_g^3}}{3e\hbar(\varepsilon_g + \Delta\phi)}\right) \quad \text{[Equation 4]}$$

With reference to [Equation 4], it is clear that, in order to accomplish high $I_{60}$, Eg, m*, and $\lambda$ need to be minimized, thereby maximizing the tunneling probability. In relation thereto, computer simulation model calculation results showed that atomically thin 2D channel materials are more advantageous to reduce $\lambda$ by gate modulation than 3D materials. A device simulation has shown that BTBT of a heterojunction (HJ) obtained by coupling a small band-gap source and a large band-gap channel material can reduce $I_{off}$, can substantially increase $I_{60}$, and can reduce SS.

However, problems such as defects occurring at the junction interface, oxides, and lattice mismatch have become major obstacles to developing high-performance HJ-TFETs. Sarkar et al. reported in a previous experiment thesis that $SS_{ave\_4dec} \approx 31$ mV/dec was accomplished in connection with a $MoS_2$/Ge vertical HJ-TFET. However, contrary to theoretical expectations, HJ-FETs merely exhibited $I_{60} \approx 4.2 \times 10^5$ µA/µm, meaning that $I_{60}/I_{off}$ is very low (about $7.0\times10^3$) due to the oxide tunnel barrier at the HJ interface formed by coupling MoS$_2$ and Ge.

Hereinafter, according to an embodiment of the present disclosure, there is provided a 2D-3D HJ-TFET wherein the same is fabricated to have a source area having a small band gap and a channel area having a large band gap by using a first material, the band gap energy of which changes depending on the thickness thereof, such as black phosphorous (BP), TMDC or other 2D materials such as tellurene and GeP, thereby preventing problems at the junction interface between heterogenous materials, and a high-K insulating film (for a tunnel barrier) and a graphite electrode layer are used in a drain area, thereby accomplishing $SS_{ave\_4dec} \approx 22.9$ mV/dec with high $I_{60}$ (=0.65-1 µA/µm), $SS_{ave\_4dec} \approx 37.6$ mV/dec with even higher $I_{60}$=19.5 µA/µm while satisfying Moore's law.

FIG. 1 is a sectional view of a 2D-3D HJ-TFET 100 according to an embodiment of the present disclosure. Hereinafter, in order to describe the structure of the 2D-3D HJ-TFET 100 according to an embodiment of the present disclosure, a method for manufacturing the same will be described together.

Referring to FIG. 1, the 2D-3D HJ-TFET 100 according to an embodiment of the present disclosure may include a back-gate electrode 20, a first insulating film 30, a material layer 40, a second insulating film 50, a graphite electrode layer or a metal electrode layer 60, a third insulating film 70, a source electrode 91, an top-gate electrode 92, and a drain electrode 93, which are formed on a substrate 10. However, the present disclosure is not necessarily limited thereto, and some of the above components may be omitted, or other components may be partially added.

More specifically, as the substrate 10, various substrates such as a SI substrate, a silicon on insulator (SOI) substrate, a sapphire substrate, and a III-V compound semiconductor substrate may be used, and an insulating film such as SiO$_2$ may be formed thereon as a buffer layer.

In addition, the back-gate electrode 20 may be formed on the substrate 10 or on an insulating film (for example, hBN, SiO$_2$, or the like) thereon as a pattern made of a metal such as Pt, Pd, Al, Cu, Au, Ag, or the like. For example, a part or all of a channel area (ii) of the material layer 40 may be formed to be placed on the back-gate electrode 20. In addition, in some cases, a part or all of a drain area (iii) of the material layer 40 may be additionally formed to be placed on the back-gate electrode 20.

In addition, the first insulting film 30 may be made of HfO$_2$, SiO$_2$, metal oxide, hBN, or the like so as to cover the back-gate electrode 20. The first insulating film 30 may include double insulating layers. For example, the first insulating film 30 may include a high-K insulating film and a hexagonal boron nitride (hBN) film thereon (double film structure). The hBN film may be formed to have a single-layer thickness (for example, 2-5 nm) to be used as a capping layer of the two-dimensional material layer 40. In addition, the high-K insulating film may be made of a material having a dielectric constant larger than SiO$_2$, such as HfO$_2$, HfSiO, HfSiON, or ZrO. The high-K insulating film may have a thickness of 2-5 nm. The high-K insulating film may be used to improve the gate efficiency, and the single-layered hBN film may be used to protect the material characteristics of the two-dimensional material layer 40, such as BP, TMDC or other 2D materials such as tellurene and GeP.

In addition, the heterojunction material layer 40 may be made of a Van der Waals material in a layered structure so as to include a first material, the band-gap energy of which changes depending on the thickness thereof, on the first insulating film 30. The first material may be black phosphorus (BP) or transition metal dichalcogenide (TMDC), or is not necessarily limited thereto. Moreover, as illustrated in FIG. 1, according to the present disclosure, the heterojunction material layer 40 may be configured to include a thick (bulk, 3D) first thickness part (for example, 60 nm-100 nm) for the source area (i) and a thin (2D) second thickness part (for example, single-layered or multi-layered (multiple monolayers) thickness) for the channel area (ii) and the drain area (iii). Such a thickness difference may occur naturally, or may be formed, for mass processing, by forming a material layer having a predetermined thickness with the first material and then performing a patterning process through a predetermined etching method, or by forming the second thickness part with a shadow mask and then processing the corresponding part such that the same does not grow any more. In addition, part or all of the channel area (ii) of the heterojunction material layer 40 or part or all of the drain area (iii) of the heterojunction material layer (40) may be formed to be placed above the back-gate electrode 20.

Figure 2:
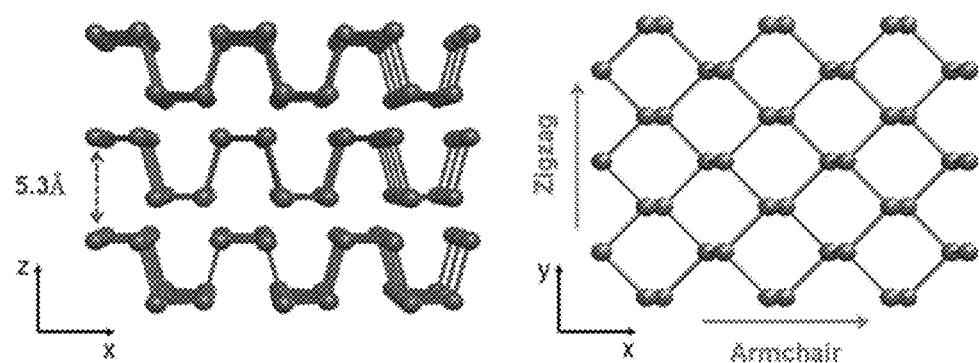
FIG. 2 is a diagram for schematically describing the crystal structure and direction of a first material.

As described above, the band-gap energy of the first material (for example, BP or TMDC) changed depending on the thickness, and even if heterogenous materials are not used, the heterojunction material layer 40 may be formed by using the first material alone, thereby implementing a 2D-3D heterojunction, on the basis of the change in band gap between the first thickness part (3D) and the second thickness part (2D). As such, in the present disclosure, the thickness may change horizontally so as to provide a source area (i) having a small band gap and a channel area (ii) having a large band gap. Furthermore, a very thin (for example, less than 1 nm) tunnel barrier high-K insulating film 50 and a graphite electrode layer or a metal electrode layer 60 may be provided in the drain area (iii), as will be described below, thereby making it possible to implement a high on-current and low SS while satisfying Moore's law, and to enable low-power driving. In addition, although it will be assumed in the following description that the heterojunction material layer is black phosphorus (BP), the same may also be implemented by using other materials such as a transition metal dichalcogenide (TMDC), including TaS$_2$, NbTe$_2$, TiSe$_2$, WS$_2$, WTe$_2$, PdSe$_2$, PtSe$_2$ and MoS$_2$, and other 2D materials such as tellurene and GeP etc, which have properties of changing bandgaps with thickness. In addition, the heterojunction material layer 40 such as BP may have crystallinity in the zigzag and armchair directions as illustrated in FIG. 2, but the present disclosure is not necessarily limited thereto.

Moreover, a second insulating film 50 and a graphite electrode layer 60 may be formed in the drain area (iii) of the heterojunction material layer 40. The graphite electrode layer 60 may be replaced with a metal electrode layer. The second insulting film 50 may be made of hBN so as to protect the material characteristics of the material layer 40. Alternatively, the second insulting film 50 may be configured as a high-K insulating film (for example, HfO$_2$) as described above, for capping, and the thickness thereof may be 1 nm or less. In addition, the second insulting film 50 may function as a tunnel barrier between the graphite electrode layer or the metal electrode layer 60 and the 2D second thickness area of the material layer 40 in the drain area (iii). The second insulting film 50 may be deposited by CVD, epitaxial growth, atomic layer deposition (ALD), or other methods. For example, the hBN film may be grown in a chemical vapor deposition (CVD) type or an epitaxy type, and the high-K insulating film may be deposited and formed in the ALD type.

Hereinafter, except for specifically-mentioned cases such as a case in which the second insulating film 50 (for example, hBN film or high-K film) has a thickness of 1 nm or less, other components of the 2D-3D HJ-TFET 100, that is, the back-gate electrode 20, the first insulating film 30, the 2D material layer 40, the graphite electrode layer or the metal electrode layer 60, the third insulating film 70, the source electrode 91, the top-gate electrode 92, and the drain electrode 93 may have thicknesses of 2-100 nm.

However, the gate efficiency needs to be improved to make the SS small, and, to this end, the first insulating film 30 and the third insulating film 70 ideally have thicknesses of 2-5 nm. It will be assumed in the following description of the 2D-3D HJ-TFET 100 according to an embodiment of the present disclosure that the same is fabricated to include such nanometer-level components (for example, 1-100 nm), but the present disclosure is not limited thereto, and the components of the 2D-3D HJ-TFET 100 according the present disclosure may be expanded to micrometer or millimeter levels, according to the design purpose such that they are implemented with large sizes above nanometer levels.

In addition, as illustrated in FIG. 1, the second insulating film 50 and the graphite electrode layer or the metal electrode layer 60 may be formed by a patterning process so as to cover the upper surface and the side surface (in the diagram, front, rear, or right side surface) of the drain area (iii) of the heterojunction material layer 40. In some cases, the graphite electrode layer or the metal electrode layer 60 may be formed only on the second insulating film above the upper surface of the drain area (iii) (for example, excluding the side surface).

Next, a third insulating film 70 may be formed to cover the heterojunction material layer 40 in the source area (i) and the channel area (ii) and the tunnel barrier second insulating film 50 and the graphite electrode layer and the metal electrode layer 60 in the drain area (iii). The third insulating film 70 may be an hBN film for capping. However, the present disclosure is not necessarily limited thereto, and a fourth insulating film 71 may be further formed between the third insulting film 70 and the top-gate electrode 92 above the heterojunction material layer 40 in the channel area (ii). For example, the third insulating film 70 may be a hBN single-layered film (for example, 2-5 nm), and the fourth insulating film 71 may be a high-K insulating film (for example, 2-5 nm) as described above. In addition, if the high-K insulating film is not used, the hBN may have a thickness of 2-5 nm and may operate as an insulator of the top-gate electrode 92. The high-K insulating film may be used to improve the gate efficiency, and the single-layered hBN film may be used to protect the material characteristics of the 2D material layer 40 (for example, BP or TMDC).

Next, a source electrode 91, a drain electrode 92, and a top-gate electrode 93 may be formed in the source area (i), the channel area (ii), and the drain area (iii), respectively. To this end, the third insulating film 70 and the fourth insulating film 71 are first subjected to a patterning process so as to expose the source area (i) and the drain area (iii) of the heterojunction material layer 40. Subsequently, through a process of forming a pattern made of a metal such as Pt, Pd, Al, Cu, Au, or Ag, the source electrode 91 may be formed to contact the source area (i) of the heterojunction material layer 40, the drain electrode 93 may be formed to contact the graphite electrode layer or the metal electrode layer 60 in the drain area (iii) of the heterojunction material layer 40, and the top-gate electrode 92 may be formed on the third insulating film 70/fourth insulating film 71 in the channel area (ii) of the heterojunction material layer 40.

As a more specific example, if a tunnel barrier second insulating film 50 and a graphite electrode layer or a metal electrode layer 60 are formed on the upper surface and the side surface of the drain area (iii) of the heterojunction material layer 40, the drain electrode 93 may be formed to contact the graphite electrode layer or the metal electrode layer 60 on the upper surface and the side surface of the drain area (iii) of the heterojunction material layer 40. Furthermore, the manner in which the second insulating film 50 and the graphite electrode layer or the metal electrode layer 60 are formed and the position in which the drain electrode 93 is placed in relation thereto may be variously implemented.

The 2D-3D HJ-TFET 100 according to an embodiment of the present disclosure, configured as above, may have an n-type or p-type operating mode by means of a bias current $V_{ds}$ applied between the drain electrode 93 and the source electrode 91. In addition, on/off switching is possible by means of a combination of gate voltages, that is, bias voltages applied to the back-gate electrode 20 and the top-gate electrode 92. In the n-type operating mode, the voltage applied to the gate electrode (for example, back-gate electrode) is increased to turn on the same, as in the case of an n-type MOSFET, and in the p-type operating mode, the voltage applied to the gate electrode (for example, top-gate electrode) is decreased to turn on the same, as in the case of a p-type MOSFET.

In order to solve the major problem (performance degradation) of conventional HJ-TFETs, and to utilize the band characteristics of a first material (for example, BP or TMDC), the band-gap energy of which changes depending on the thickness thereof, the 2D-3D HJ-TFET 100 according to an embodiment of the present disclosure has multiple bulk layers and a monolayer (ML) by using the first material, respectively, so as to constitute a heterojunction material layer 40 for a source and a channel of a HJ-TFET.

For example, a direct band gap changes, depending on the layer thickness, from $Eg \approx 2.0$ eV in the case of ML BP to $Eg \approx 0.3$ eV in the case of bulk BP. Such thickness-dependent band characteristics make it possible to solve the major problem of conventional HJ-FETs. Accordingly, the 2D-3D HJ-TFET 100 according to an embodiment of the present disclosure does not have a heterojunction (HJ) formed by combing different materials, but may have a HJ formed by changing the BP thickness, thereby solving the problem (for example, defects at the junction interface) that degrades the conventional FTET performance.

In addition, the armchair-direction effective carrier mass of BP in FIG. 2, which is substantially smaller than other 2D materials having non-zero band gaps, including (TMDCs (MoS$_2$: 0.55-0.56 $m_e$, MoSe$_2$: 0.49-0.61 $m_e$, and WSe$_2$: 0.44-0.48 $m_e$)), is 0.15 and 0.17 $m_e$ in the case of holes and electrons, respectively. Therefore, this may mean that, referring to [Equation 4], $I_{60}$ in the case of the BP TFET may be higher than that of other Van der Waals material-based TFETs. Due to such band characteristics unique to BP, the 2D-3D HJ-TFET 100 according to the present disclosure can acquire the lowest $SS_{ave\_4dec} \approx 26$ mV/dec, the highest $I_{60} \approx 1.0$ μA/μm, and $I_{60}/I_{off}$ is about $3.6 \times 10^5$, among all TFETs reported so far.

In addition, the 2D-3D HJ-TFET 100 according to an embodiment of the present disclosure may have a second insulating film 50 deposited between a monolayer drain heterojunction material layer 40 and a metal drain electrode 93 (or graphite electrode layer or metal electrode layer 60) in an atomic layer deposition (ALD) type by using a high-K insulator (for example, HfO$_2$), unlike conventional TFETs.

If the 2D-3D HJ-TFET 100 according to an embodiment of the present disclosure has a high-K second insulating film 50 beneath the drain electrode 93, a complementary TFET can be implemented for the first time, that is, a single element can be operated either in n-type or in p-type according to the polarity of the bias voltage applied between the drain electrode 93 and the source electrode 91 as described above. The role of the tunnel barrier in this case is as follows. First, it is known that the band structure of a normal monolayer (ML) 2D material may be destroyed when a metal electrode is deposited, thereby causing metallization, and a side effect such as Fermi level pinning may occur. An insulator (for example, $HfO_2$) between a heterojunction material layer 40 and a metal drain electrode 93, proposed by the present disclosure, can fundamentally solve such problems, thereby improving the HJ-TFET performance. Second, the insulator $HfO_2$ advantageously adjusts the doping level of the drain area monolayer (ML) 2D material according to the sign of the drain-source voltage $V_{ds}$. If the $V_{ds}$ is applied to a normal TFET, there occurs only an electrochemical potential difference of the carrier. In the case of the 2D-3D HJ-TFET 100 according to an embodiment of the present disclosure, the $V_{ds}$ forms capacitive coupling through the $HfO_2$ placed at the drain, thereby making it possible to additionally adjust the doping of the monolayer (ML) drain 2D material. That is, adjustment of the $V_{ds}$ makes it possible to transition the monolayer (ML) band of the drain area (iii) as in FIG. 3, thereby obtaining the result of inducing doping of the drain material such that a transition to n- ($V_{sd}$>0) or p- ($V_{sd}$<0) in a MOSFET. As a result, an n-type/p-type complementary operation in a single TFET element becomes possible.

Accordingly, if a tunneling energy window (ΔΦ>0) is opened between the source area (i) bulk and the drain area (iii) by adjusting the doping in the channel area (ii) with the voltage $V_{td}$ of the top-gate electrode 92 positioned in the channel area (ii) of the monolayer (ML) heterojunction material layer 40 (see [Equation 4]), an on-state current flows by means of the mechanism of band-to-band tunneling (BTBT). Likewise, if the energy window between the source area (i) and the drain area (iii) is closed by adjusting $V_{tg}$, an off state arrives. Such an operating principle makes it possible to use a single TFET either in n-type or in p-type, and the same can operate as a low-power high-performance HJ-TFET.

Hereinafter, the present disclosure will be described with reference to FIG. 2, FIG. 3A, FIG. 3B, FIG. 3C, FIG. 4A, FIG. 4B, FIG. 5A, and FIG. 5B. However, the present disclosure is not limited to the embodiments and experiment data in FIG. 2, FIG. 3A, FIG. 3B, FIG. 3C, FIG. 4A, FIG. 4B, FIG. 5A, and FIG. 5B, and the 2D-3D HJ-TFET 100 according to the present disclosure may be implemented in more diversified embodiments.

Figure 3A:
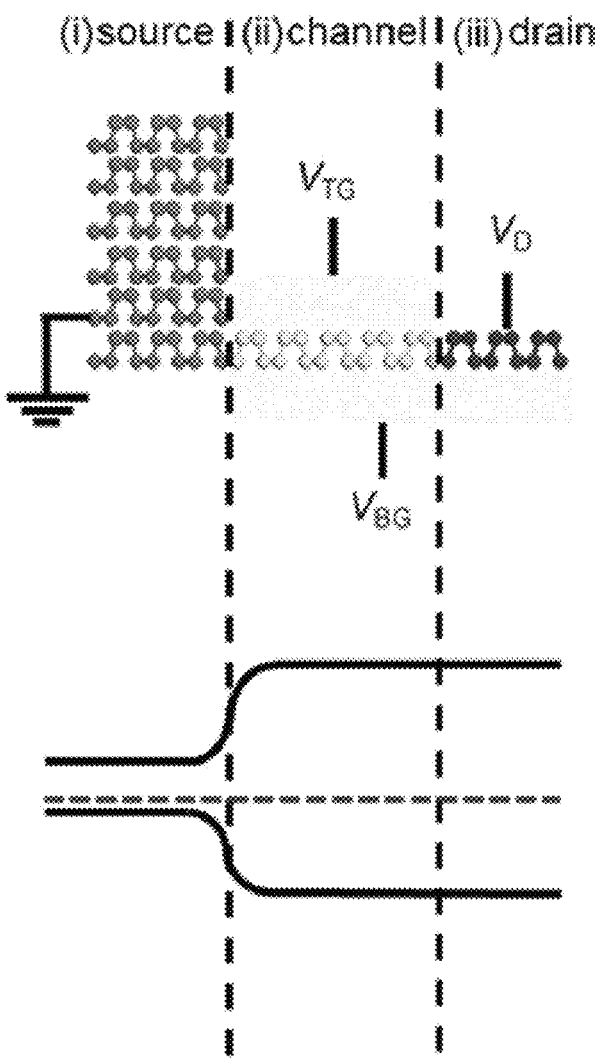
FIG. 3A, FIG. 3B, and FIG. 3C are IV graphs for describing n-type and p-type operations of a 2D-3D HJ-TFET according to an embodiment of the present disclosure.
Figure 3B:
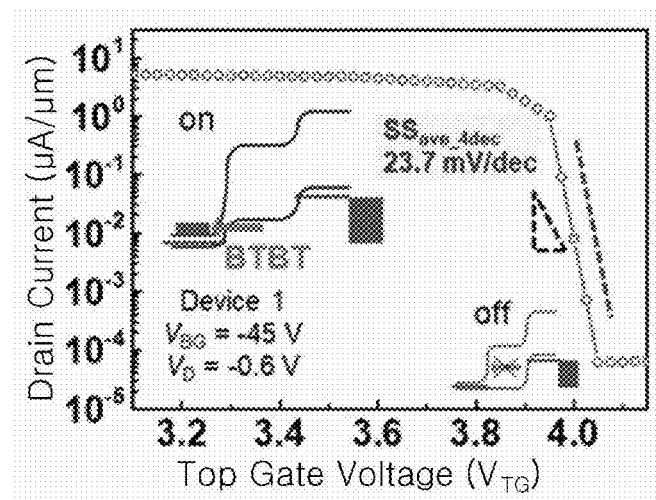
Figure 3C:
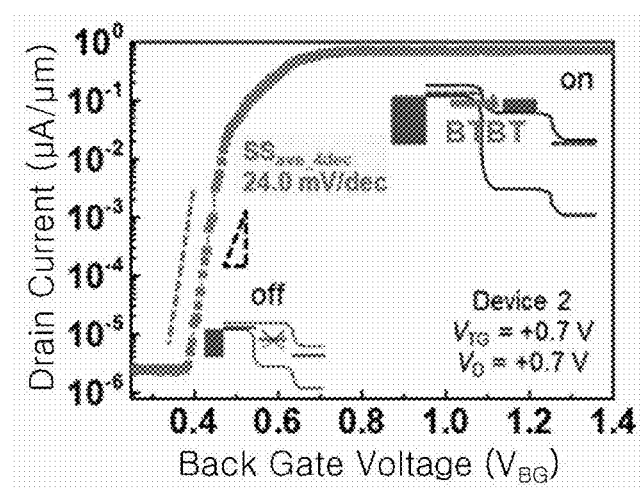

FIG. 3B and FIG. 3C are IV graphs for describing n-type and p-type operations of the 2D-3D HJ-TFET 100 in FIG. 1 (see preceding research experiment results of the present inventors, Nature Nanotechnology 15, 203 (2020)). The graphs illustrate BP band characteristics and IV transfer curves of two 2D-3D HJ-TFETs made of BP at drain electrode 93 voltage |$V_D$|0.7V, when the voltage at the source electrode 91 is grounded (Vs=0).

In addition, FIG. 3A is a diagram illustrating the structure of the 2D-3D HJ-TFET 100 and the BP band of each part of the source, channel, and drain. The BP expressed with different degrees of brightness in respective areas (i, ii, iii) indicates that each area has a different doping level. The n-type and p-type operating modes are determined by the polarity (positive sign or negative sign) of the bias voltage $V_D$ applied to the drain electrode 93 corresponding to the drain area (iii) of the ML BP.

FIG. 3B illustrates a transfer curve of a p-type 2D-3D HJ-TFET 100 at $V_D$=−0.6V, and on/off switching needs voltage swing of the top-gate electrode 92 ($\Delta V_{TG}$=0.15V). FIG. 3C illustrates a transfer curve of an n-type 2D-3D HJ-TFET 100 at $V_D$=+0.7V, and on/off switching needs voltage swing of the back-gate electrode 20 ($\Delta V_{BG}$=0.2V).

Dotted lines of switching parts in FIG. 3B and FIG. 3C denote subthreshold inclinations regarding respective devices, and triangles with dotted lines show subthreshold inclinations when SS=60 mV/dec, for comparison. By controlling $V_{BG}$, $V_{TG}$, and $V_D$, parts (ii) and (iii) can be adjusted of the 2D material layer 40 such that tunneling window energy (ΔΦ>0) occurs between the bulk 3D and ML 2D BP. As a result, band-to-band tunneling (BTBT) becomes possible throughout the source area (i), the channel area (ii), and the drain area (iii). If the energy window is blocked, the TFET is turned off.

FIG. 3B illustrates the first p-type TFET operation in the first device when $SS_{ave\_4dec}$<60 mV/dec. In addition, the first device p-type operation at $V_D$=0.6V is superior to all conventional TFETs (including n-type TFETs) in terms of both $SS_{ave\_4dec}$ and $I_{60}$, and $I_{60}$ is close to the required range (1-10 μA/μm). Measured drain current $I_D$ vs. $V_{TG}$ (in FIG. 3B, gate dielectric material: hBN 5 nm) represents $SS_{ave\_4dec}$≈23.7 mV/dec and $I_{60}$≈0.65 μA/μm.

In addition, in FIG. 3C, the n-type operation of the second device at $V_D$=+0.7V shows substantially low $SS_{ave\_4dec}$ and highest $I_{60}$ among all previous TFETs having sub-thermionic $SS_{ave\_4dec}$. Measured $I_D$ and $V_{BG}$ (gate dielectric material: hBN 3 nm) represent $SS_{ave\_4dec}$≈24.0 mV/dec and $I_{60}$≈0.054 μA/μm. On/off switching needs substantially low voltages of $\Delta V_{TG}$=0.15V and $\Delta V_{BG}$=0.2V with regard to the first and second devices, respectively, compared with $\Delta_{VG}$=0.7V of recent MOSFETs, meaning that the BP 2D-3D HJ-TFET 100 according to the present disclosure can substantially reduce power consumption.

The 3D source area (i) of the heterojunction material layer 40 (for example, bulk BP) has a large thickness (for example, 60-100 nm) and thus does not change according to the gate voltage. Accordingly, the top-gate voltage $V_{TG}$ and the back-gate voltage $V_{BG}$ alone affect the channel area (ii) and the drain area (iii). The tunnel barrier junction obtained by using a super-thin second insulating film 50 (may include 2-3 layers of hBN or $HfO_2$) between the graphite electrode layer or the metal electrode layer 60 and the heterojunction material layer 40 (for example, ML BP) in the drain area (iii) is more advantageous than a direct junction of graphite or metal in the heterojunction material layer 40.

As a more specific example, the strong chemical interaction between the heterojunction material layer 40 (for example, ML BP) and metal atoms of the graphite electrode layer, the metal electrode layer 60, or the drain electrode 93 may destroy the band structure of the heterojunction material layer 40 and cause materialization. Therefore, the super-thin second insulating film 50 (for example, hBN) may protect the heterojunction material layer 50. In addition, the super-thin second insulating film 50 increases the distance between the heterojunction material layer 40 and the graphite electrode layer, the metal electrode layer 60, or the drain electrode 93. Accordingly, Fermi level pinning does not occur in the drain area (iii) (for example, ML BP). It is expected that Fermi level pinning will occur due to the chemical coupling between atoms P of the BP heterojunction material layer 40 and the metal atoms, regardless of the metal work function. Therefore, the chemical potential of the ML BP drain area (iii) may be adjusted by the drain electrode 93 bias voltage $V_D$ applied to the graphite electrode layer or the metal electrode layer 60, which has a super-thin second insulating film 50 (for example, hBN) disposed between the graphite electrode layer or the metal electrode layer 60 and the heterojunction material layer 40 (for example, ML BP). In addition, if BP is used for the heterojunction material layer 40, the device is preferably fabricated such that carriers are transferred in the armchair direction, which has smaller m* than the zigzag direction, in order to increase the on-current. Even if other kinds of TMDC are used for the heterojunction material layer 40, the device is preferably fabricated such that carriers are injected in the direction having small m*, in order to increase the on-current.

Device optimization regarding n-type and p-type TFETs is crucial to developing a low-power complementary TFET technology for CMOS operations. As described above, positive (or negative) $V_D$ moves the drain area (iii) downwards (or upwards). If the drain area (iii) ML band edge is controlled by $V_D$, it is possible to operate a device having a heterojunction material layer 40 (for example, BP or TMDC) as a complementary n-type/p-type TFET according to the sign of $V_D$. It is to be noted that, if $V_D$ does not move the band of the ML BP drain area (iii), the device according to the present disclosure cannot operate as a complementary TFET regardless of the sign of $V_D$. In an on-state, the ML BP channel area (ii) and the ML BP drain area (iii) are adjusted by the gate voltage such that a tunneling energy window ($\Delta\Phi>0$) is opened between the bulk 3D and the heterojunction material layer 40 (for example, ML 2D BP or TMDC). Therefore, the BTBT tunneling probability ([Equation 4]) becomes important. If the tunneling energy window is blocked, the TFET is turned off. In the case of an n-type TFET corresponding to $V_D>0$, $\Delta\Phi$=[maximum value of valence band of heterojunction material layer 40 such as source-side bulk 3D BP]−[minimum value of conduction band of heterojunction material layer 40 such as ML BP 2D]; in the case of a p-type TFET corresponding to $V_D<0$, $\Delta\Phi$=[maximum value of valence band of heterojunction material layer 40 such as ML BP 2D]−[minimum value of conduction band of heterojunction material layer 40 such as source-side bulk 3D BP].

Figure 4A:
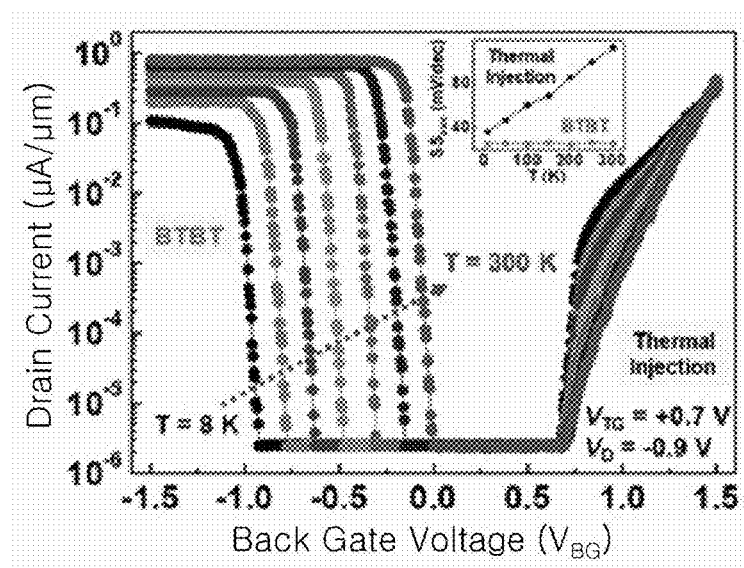
FIG. 4A and FIG. 4B illustrate transfer curves according to temperatures resulting from two different carrier injection mechanisms (BTBT and thermal injection) of a 2D-3D HJ-TFET according to an embodiment of the present disclosure.
Figure 4B:
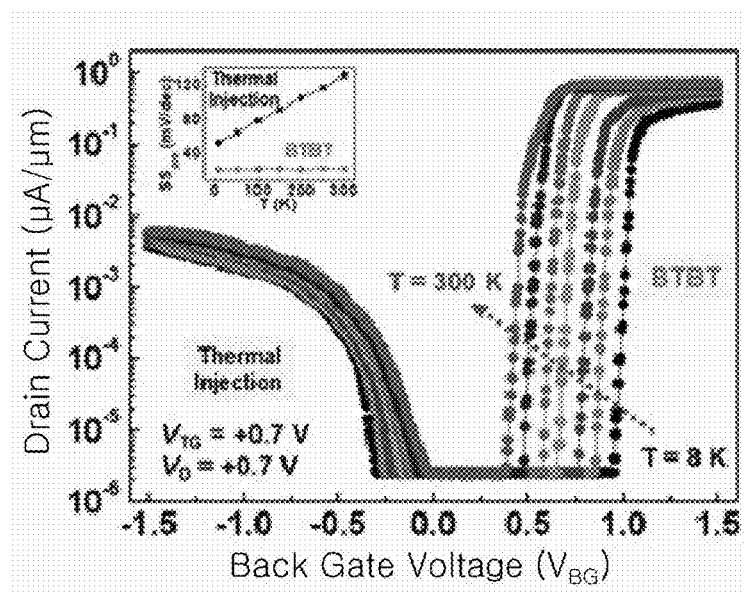

FIG. 4A and FIG. 4B illustrate transfer curves according to temperatures resulting from two different carrier injection mechanisms (BTBT and thermal injection) of a 2D-3D HJ-TFET 100 according to an embodiment of the present disclosure.

FIG. 4A illustrates a transfer curve according to temperatures regarding n-type 2D-3D TFET operations. As indicated by arrows in FIG. 4A and FIG. 4B (from left to right in FIG. 4A, and from right to left in FIG. 4B), transfer curves measured at temperatures from 8 K to 300 K in a 50 K unit are illustrated.

BTBT on/off switching occurs according to the gate voltage, changes differently depending on the temperature, and has an increased transition gap at a low temperature. This may be related to the state of impurities inside the gap or a change in the doping level according to the temperature. Referring to graphs inside small boxes within the graphs of FIG. 4A and FIG. 4B, block lines and points (linear graphs) represent $SS_{ave\_2dec}$ measured at thermal injection limits, and change linearly according to the temperature. In addition, referring to the graphs inside the small boxes, lines and points labeled BTBT (lower graphs showing no changes) represent $SS_{ave\_2dec}$ measured at BTBT limits, and are almost irrelevant to temperatures.

As described above, in the case of a device having a heterojunction material layer 40 formed as a result of a thickness change (for example, 2D-3D BP or TMDC), two on/off mechanisms exist according to $V_{BG}$ and $V_D$. That is, thermal injection occurs when the barrier is decreased by $V_{BG}$ inside ML BP between the channel area (ii) and the drain area (iii), thereby enabling hot carriers to move over the barrier. On the other hand, if the source area (bulk BP, area (i)) and the channel area (ML BP, area (ii)) are doped inversely, thereby opening a tunnel window ($\Delta\Phi>0$), BTBT occurs. $SS_{ave\_4dec}$ and $SS_{ave\_3dec}$ were extracted in BTBT and thermal injection areas from temperature-dependent transfer curves, respectively. It is clear from FIG. 4A and FIG. 4B that both p-type and n-type operations having $SS_{ave\_4dec}<60$ mV/dec at T=300 K maintain constant $SS_{ave\_4dec}$ across 8-300 K, and the carrier injection mechanism is BTBT. When BTBT is dominant, the thermal activation part of the source Fermi distribution, which is above the maximum value of the valence band of the source and the channel, and which is equal to/less than the minimum value of the conduction band, is effectively blocked, and the tunneling probability ([Equation 4]) accordingly becomes irrelevant to temperatures. Therefore, the electron system is effectively cooled, and can maintain a low temperature. On the other hand, in line with an exponential increase in carriers that are thermally activated beyond a potential barrier having a temperature T, SS exhibits linear dependency on the temperature T at the thermal injection limit. Temperature-dependent transfer curves exhibit additional characteristics during BTBT transition. On/off switching occurs according to the gate voltage, and changes differently according to the temperature, and the off-state (transport gap) has a wider gate voltage at a lower temperature. The transport gap increased at a lower temperature is not consistent with the predicted theoretical calculation, because the band gap of ML BP will decrease at a low temperature. A decrease in the transport gap at a high temperature may be related to the state of impurities inside the gap or a changed in the doping level according to the temperature.

Figure 5A:
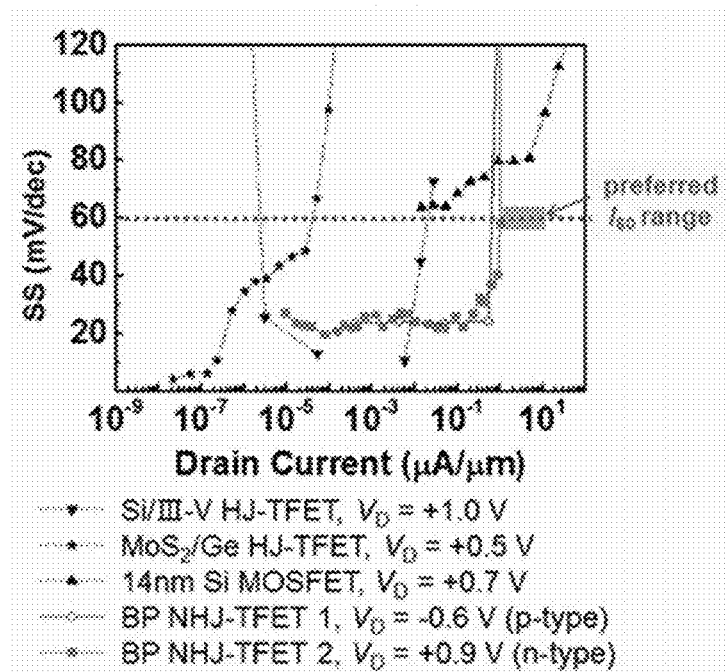
FIG. 5A and FIG. 5B show results of comparing the SS performance and four-decade sub-thermionic SS average of a latest 14 nm Si MOSFET from Intel, a conventional n-type HJ-TFET, and a BP 2D-3D HJ-TFET according to an embodiment of the present disclosure.
Figure 5B:
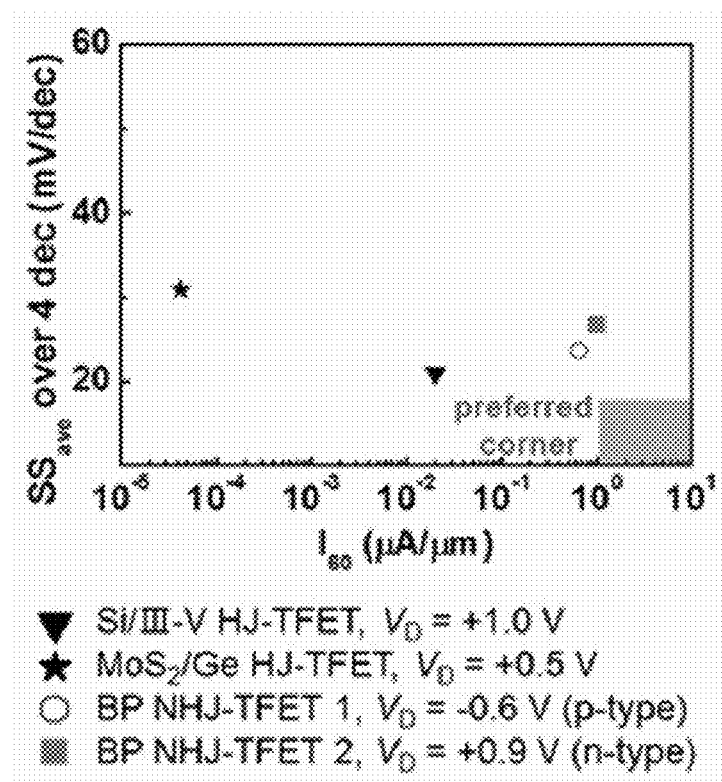

FIG. 5A and FIG. 5B show results of comparing the SS performance and four-decade sub-thermionic SS average of a latest 14 nm Si MOSFET from Intel, a conventional n-type HJ-TFET, and a BP 2D-3D HJ-TFET 100 according to the present disclosure (see preceding research experiment results of the present inventors, Nature Nanotechnology 15, 203 (2020)).

FIG. 5A illustrates SS data regarding $I_D$ extracted from a transfer curve, the horizontal dotted line at the center represents SS=60 mV/dec, and the square indicating a preferred $I_{60}$ range on the center dotted line represents a (1-10 µA/µm) range. Black triangular dots indicate data regarding an n-type 14 nm Si MOSFET.

FIG. 5B illustrates $SS_{ave\_4dec}$ data regarding $I_{60}$ extracted from a transfer curve, and the square indicating a preferred $I_{60}$ range (preferred corner) at the right bottom represents a preferred $I_{60}$ range 1-10 µA/µm at low $SS_{ave\_4dec}<20$ mV/dec. Inverted triangles and star-shaped dots represent data regarding a conventional Si/III-V HJ-TFET and MoS2/Ge HJ-TFET. Point data marked by hollow circles indicates a p-type BP 2D-3D HJ-TFET device according to the present disclosure at $V_D$=−0.6V, and point data marked by small squares indicates an n-type BP 2D-3D HJ-TFET device according to the present disclosure at $V_D$=+0.9V.

It is clear from the comparative data in FIG. 5A and FIG. 5B that the BP (or TMDC) 2D-3D HJ-TFET 100 device according to the present disclosure is superior to other conventional TFETs. What is more important is the fact that the BP 2D-3D HJ-TFET 100 device according to the present disclosure can simultaneously satisfy two essential requirements (sub-thermionic $SS_{ave\_4dec}$ and high $I_{60}$) in both p- and n-type operations for the first time.

More specifically, only two n-type TFETs capable of accomplishing sub-thermionic $SS_{ave}$<60 mV/dec with regard to four-decade currents have been reported to date (p-type TFETs have failed to be implemented), and the two n-type TFETs have a limitation in that they have $I_{60}$ lower than the required range 1-10 µA/µm by 2-5 orders.

In contrast, it is clear from FIG. 5A that the BP 2D-3D HJ-TFET 100 according to the present disclosure has $I_{off}$ having a size lower than that of the Intel 14 nm Si MOSFET by 3-4 orders, standby power consumption is reduced by $10^3$-$10^4$, and $I_{60}$ is about 1 µA/µm, which has been sufficiently improved to be comparable to the on-current near the threshold voltage of MOSFETs. This also implies that the 2D-3D HJ-TFET 100 according to the present disclosure can be a competitive replacement to a low-power switch operating at a sufficiently high speed.

FIG. 5B shows that the performance of the 2D-3D HJ-TFET 100 according to the present disclosure is, compared with other conventional TFETs, closest to a performance level requiring two major performance indices, that is, low $SS_{ave\_4dec}$ and high $I_{60}$.

The lowest drain voltage implemented in the preceding research of the present inventors is $V_D$=−0.6V in the case of p-type operation, and $V_D$=+0.7V in the case of n-type operation. However, $V_D$ can be further reduced by a performance improvement resulting from selective use of a high-K dielectric material between a graphite electrode layer or a metal electrode layer 60 and a ML BP heterojunction material layer 40 (or control of chemical doping in the drain area (iii)). In addition, the present disclosure has no problem such as defects at the junction interface between heterogenous materials in the case of the BP 2D-3D HJ, and the on-current of the BP 2D-3D HJ-TFET 100 can be improved to the level of the on-current of a MOSFET (100-1000 µA/µm) at a low bias equal to/less than 0.5V.

Accordingly, the 2D-3D HJ-TFET 100 according to an embodiment of the present disclosure has a heterojunction material layer configured to include a first thickness part for a source area and a second thickness part for a channel area and a drain area by using a first material, the band-gap energy of which changes depending on the thickness, such as black phosphorous (BP), transition metal dichalcogenide (TMDC) or other 2D materials such as tellurene and GeP, thereby having a thickness difference. Therefore, it is possible to implement a TFET which consumes less power, which has a high switching speed, which can operate in a complementary manner, which can replace a conventional CMOS transistor, and which can extend Moore's law.

What is claimed is:

1. A transistor comprising:
    a back-gate electrode;
    a first insulating film formed on the back-gate electrode;
    a heterojunction material layer formed on the first insulating film and made of a first material, band-gap energy of which changes according to a thickness, the heterojunction material layer comprising a first thickness part for a source area and a second thickness part for a channel area and a drain area, thereby having a thickness difference, the first thickness part and the second thickness part having different thicknesses;
    a source electrode formed in the source area of the first thickness part;
    a drain electrode formed in the drain area of the second thickness part; and
    a top-gate electrode formed in the channel area of the second thickness part.

2. The transistor of claim 1, further comprising a second insulating film and a graphite electrode layer or a metal electrode layer formed in the drain area of the heterojunction material layer.

3. The transistor of claim 2, further comprising a third insulating film covering the heterojunction material layer in the source area and the channel area and the graphite electrode layer or the metal electrode layer in the drain area,
    wherein the drain electrode is formed on the graphite electrode layer or the metal electrode layer in the drain area of the heterojunction material layer, and
    wherein the top-gate electrode is formed on the third insulating film in the channel area of the heterojunction material layer.

4. The transistor of claim 3, wherein the second insulating film functions as a tunnel barrier between the graphite electrode layer or the metal electrode layer and the heterojunction material layer in the drain area.

5. The transistor of claim 3, further comprising a fourth insulating film between the third insulating film and the top-gate electrode, on the heterojunction material layer in the channel area.

6. The transistor of claim 5, wherein the third insulating film is a hBN film, and the fourth insulating film comprises a high-κ insulating film.

7. The transistor of claim 3, wherein, when the second insulating film and the graphite electrode layer or the metal electrode layer are formed on an upper surface and a side surface of the drain area of the heterojunction material layer, the drain electrode is structured to contact the graphite electrode layer or the metal electrode layer.

8. The transistor of claim 2, wherein the second insulating film comprises hBN film or a high-κ insulating film.

9. The transistor of claim 8, wherein the hBN film is grown in a chemical vapor deposition (CVD) or epitaxy type.

10. The transistor of claim 8, wherein the high-κ insulating film is deposited and formed in an atomic layer deposition (ALD) type.

11. The transistor of claim 2, wherein the second insulating film has a thickness or 1 nm or less.

12. The transistor of claim 1, wherein, in the heterojunction material layer, a heterojunction is formed by a thickness difference within a single material layer, even without using different materials, according to a band-gap change between the first thickness part and the second thickness part.

13. The transistor of claim 1, wherein the heterojunction material layer comprises a structure in which the first thickness part is a bulk (3D) material layer, and the second thickness part is a monolayer (2D) material layer.

14. The transistor of claim 1, wherein the heterojunction material layer comprises a Van der Waals material layer having a layered structure comprising black phosphorus (BP), transition metal dichalcogenide (TMDC) or other 2D materials such as tellurene and GeP.

15. The transistor of claim 1, wherein the first insulating film comprises an insulating film double-layer.

16. The transistor of claim 1, wherein the first insulating film comprises a high-κ insulating film and a hBN film thereon.

17. The transistor of claim 1, wherein the transistor operates in an n-type or in a p-type according to polarity of a bias voltage applied between the drain electrode and the source electrode.

18. A method for manufacturing a transistor, the method comprising:
    forming a back-gate electrode;
    forming a first insulating film formed on the back-gate electrode;
    forming a heterojunction material layer on the first insulating film by using a first material, band-gap energy of which changes according to a thickness, the heterojunction material layer comprising a first thickness part for a source area and a second thickness part for a channel area and a drain area, thereby having a thickness difference, the first thickness part and the second thickness part having different thicknesses; and
    forming a source electrode in the source area of the first thickness part, a drain electrode in the drain area of the second thickness part, and a top-gate electrode in the channel area of the second thickness part.

19. The method of claim 18, further comprising forming a second insulating film and a graphite electrode layer or a metal electrode layer formed in the drain area of the heterojunction material layer.

20. The method of claim 19, further comprising forming a third insulating film so as to cover the heterojunction material layer in the source area and the channel area and the graphite electrode layer or the metal electrode layer in the drain area,
    wherein the drain electrode is formed on the graphite electrode layer or the metal electrode layer in the drain area of the heterojunction material layer, and
    wherein the top-gate electrode is formed on the third insulating film in the channel area of the heterojunction material layer.

* * * * *